(12) United States Patent
Kwak et al.

(10) Patent No.: US 7,948,166 B2
(45) Date of Patent: May 24, 2011

(54) ORGANIC LIGHT EMITTING DISPLAY APPARATUS

(75) Inventors: Noh-Min Kwak, Suwon-si (KR);
Sung-Soo Koh, Suwon-si (KR);
Myung-Won Song, Suwon-si (KR);
Seong-Taek Lee, Suwon-si (KR);
Hye-Dong Kim, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 556 days.

(21) Appl. No.: 12/068,363

(22) Filed: Feb. 5, 2008

(65) Prior Publication Data
US 2008/0309224 A1 Dec. 18, 2008

(30) Foreign Application Priority Data

Jun. 13, 2007 (KR) .................. 10-2007-0058005

(51) Int. Cl.
*H01J 1/62* (2006.01)
(52) U.S. Cl. .................. 313/504; 313/112
(58) Field of Classification Search .......... 313/500–504, 313/110, 112
See application file for complete search history.

(56) References Cited

U.S. PATENT DOCUMENTS

| 7,009,340 B2 * | 3/2006 | Asai et al. ............ 313/512 |
| 2008/0175605 A1 * | 7/2008 | Sakurai ............ 399/4 |

FOREIGN PATENT DOCUMENTS

| JP | 2004-031350 | 1/2004 |
| JP | 2004-039500 | 2/2004 |
| JP | 2004-227940 | 8/2004 |
| KR | 10-2005-0078287 | 8/2005 |
| KR | 10-2006-0081190 | 7/2006 |

OTHER PUBLICATIONS

*Registration Determination Certification* from the Korean Patent Office issued in Applicant's corresponding Korean Patent Application No. 2007-0058005 dated Apr. 28, 2008.

* cited by examiner

*Primary Examiner* — Joseph L Williams
*Assistant Examiner* — Brenitra M Lee
(74) *Attorney, Agent, or Firm* — Robert E. Bushnell, Esq.

(57) ABSTRACT

An organic light emitting display apparatus includes: a substrate; a display unit including a plurality of subpixels arranged on the substrate, the plurality of subpixels respectively emitting different colored light; a sealing substrate arranged on the display unit; a micro lens unit including a plurality of micro lenses arranged on a surface of the sealing substrate facing the display unit; barrier ribs arranged between the sealing substrate and the substrate to define a space between the micro lens unit and the display unit; and a black matrix arranged under the barrier ribs.

17 Claims, 6 Drawing Sheets

ORGANIC LIGHT EMITTING DISPLAY APPARATUS

CLAIM OF PRIORITY

This application makes reference to, incorporates the same herein, and claims all benefits accruing under 35 U.S.C. §119 from an application for ORGANIC LIGHT EMITTING DISPLAY APPARATUS earlier filed in the Korean Intellectual Property Office on 13 Jun. 2007 and there duly assigned Serial No. 10-2007-0058005.

BACKGROUND OF THE INVENTION

1. Field of the Invention

The present invention relates to an organic light emitting display apparatus, and more particularly, the present invention relates to a high reliability organic light emitting display apparatus in which color distortion is prevented.

2. Description of the Related Art

A flat panel display apparatus includes a substrate, a display unit including a plurality of subpixels formed on the substrate, and a sealing substrate disposed on the display unit.

In an organic light emitting display apparatus, which is a flat panel display apparatus using a self-emission device, external light interference occurs due to reflection between the sealing substrate and the display unit. There are two types of interference in terms of a destructive interference and a constructive interference. If a destructive interference occurs, the phases of light cancel each other and the generated light becomes weaker. On the other hand, if a constructive interference occurs, the phases of light constructively add with each other and the generated light becomes brighter. Such a phenomenon is called a Newton ring phenomenon, and may cause a luminosity irregularity and decrease the displaying properties of an organic light emitting display apparatus.

Such a Newton ring phenomenon can be prevented by spacing apart the sealing substrate and the display unit. As such, middle and large organic light emitting display apparatuses may also have low reliability due to the Newton ring phenomenon.

SUMMARY OF THE INVENTION

The present invention provides a highly-efficient, high reliability organic light emitting display apparatus including a sealing substrate.

According to an aspect of the present invention, an organic light emitting display apparatus is provided, the apparatus including: a substrate; a display unit including a plurality of subpixels arranged on the substrate, the plurality of subpixels emitting different colored light; a sealing substrate arranged on the display unit; a micro lens unit including a plurality of lenses formed on a surface of the sealing substrate facing the display unit; barrier ribs formed between the sealing substrate and the substrate to define a space between the micro lens unit and the display unit; and a black matrix arranged under the barrier ribs.

Each lens preferably corresponds to each subpixel.

The barrier ribs preferably define each subpixel.

The barrier ribs preferably define at least one subpixel.

The sealing substrate, the micro lens unit, and the barrier ribs are preferably integrally formed.

Each lens is preferably curved toward to the display unit.

The organic light emitting display apparatus may preferably further include a color filter arranged on a top surface of the sealing substrate.

A single lens of the micro lens preferably corresponds to a plurality of subpixels emitting the same color light.

The barrier ribs are preferably arranged between at least one pair of lenses.

The sealing substrate, the micro lens unit, and the barrier ribs are preferably integrally formed.

Each lens is preferably a cylindrical lens.

Each lens is alternatively preferably a lenticular lens.

The organic light emitting display apparatus may preferably further include a color filter arranged on a top surface of the sealing substrate.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
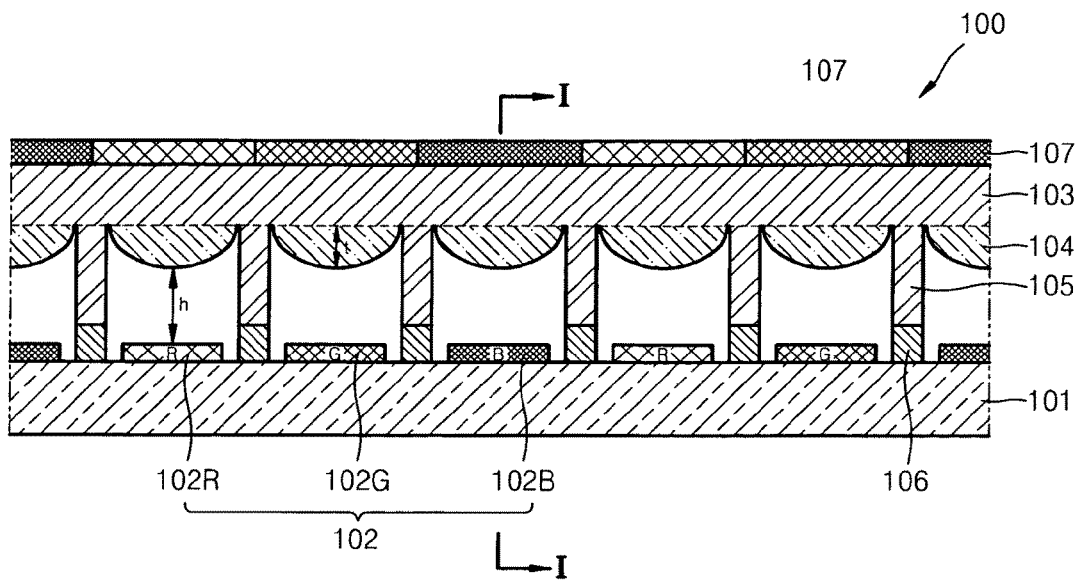
FIG. 1 is a cross-sectional view of an organic light emitting display apparatus according to an embodiment of the present invention.

The present invention is described more fully below with reference to the accompanying drawings, in which exemplary embodiments of the present invention are shown. The present invention may, however, be embodied in many different forms and should not be construed as being limited to the embodiments set forth herein. Rather, these embodiments are provided so that this disclosure will be thorough and complete, and will fully convey the concept of the present invention to those skilled in the art. In the drawings, the thicknesses of layers and regions have been exaggerated for clarity. Like reference numerals in the drawings denote like elements, and thus their descriptions have not been repeated.

Figure 2:
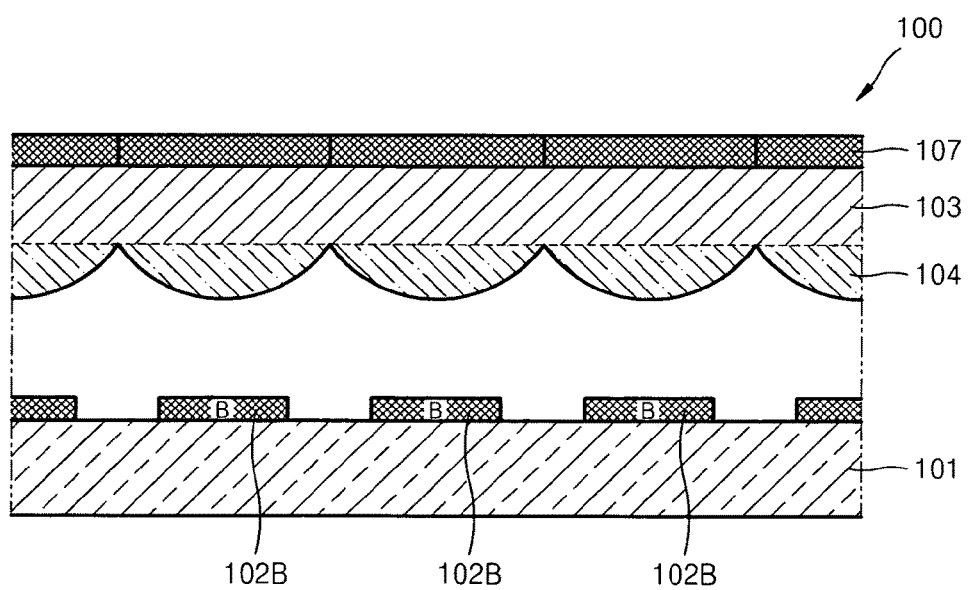
FIG. 2 is a cross-sectional view taken along line I-I of FIG. 1, according to an embodiment of the present invention.

FIG. 1 is a cross-sectional view of an organic light emitting display apparatus 100 according to an embodiment of the present invention. FIG. 2 is a cross-sectional view taken along line I-I of FIG. 1, according to an embodiment of the present invention.

Referring to FIGS. 1 and 2, the organic light emitting display apparatus 100 includes a substrate 101, a display unit 102, a sealing substrate 103, a micro lens unit 104, barrier ribs 105, black matrix 106, and a color filter 107.

The display unit 102 includes an organic light emitting device and is disposed on the substrate 101. The substrate 101 can be, in addition to a glass substrate, a plastic substrate formed of, for example, acryl. In some cases, the substrate 101 can be a metallic substrate. If needed, a buffer layer (not shown) may be further disposed on the substrate 101.

The sealing substrate 103 is disposed on the display unit 102 and attached to the substrate 101. The sealing substrate 103 can be in addition to a glass substrate, a plastic substrate formed of, for example, acryl. In addition, the sealing substrate 103 may be formed of an electrically insulating material having a high transmissivity with respect to light generated in the display unit 102 For example, such an electrically insulating material of the sealing substrate 103 can be transparent alkali glass or alkali-free gas; transparent ceramics, such as polyethylene terephthalate, polycarbonate, poly ether sulfone, polyvinyl fluoride (PVF), poly acrylate, or zirconia, or quartz.

The micro lens unit 104 is formed on a surface of the sealing substrate 103 that faces the display unit 102, and the micro lens unit 104 includes a plurality of lenses.

The lenses of the display unit 102 correspond to a plurality of subpixels on a one to one basis. Specifically, the term 'one to one' indicates that a single lens corresponds to a single subpixel that emits light and the centers of each lens and each subpixel are vertically lined up with each other. As described above, by disposing the lenses of the micro lens unit 104 such that each lens corresponds to each subpixel, light of the subpixels are efficiently condensed by the lenses, and thus, a light extraction efficiency of the organic light emitting display apparatus 100 is increased.

In addition, since each lens of the micro lens unit 104 corresponds to each subpixel, light emitted from each subpixel is condensed by the corresponding lens, and thus, a linearity of an image is improved.

The lenses of the micro lens unit 104 may be curved toward the display unit 102, and the maximum curvature of the curve may have a height (t) of 15-20 µm.

The barrier ribs 105 are formed between the sealing substrate 103 and the substrate 101, and thus, the barrier ribs 105 form a space h between the micro lens unit 104 and the display unit 102. The barrier ribs 105 define each of the subpixels 102R, 102G, and 102B. However, the structure of the barrier ribs 105 is not limited thereto and the barrier ribs 105 can define a plurality of subpixels 102R, 102G, and 102B.

As described above, the micro lens unit 104 condenses the light emitted from the display unit 102 and thus the light extraction efficiency of the organic light emitting display apparatus I 00 is increased. The light extraction efficiency that is affected by the micro lens unit 104 may be dependent on the space h between the display unit 102 and the micro lens unit 104. The barrier ribs 105 function to maintain the space h between the micro lens unit 104 and the display unit.

Figure 8:
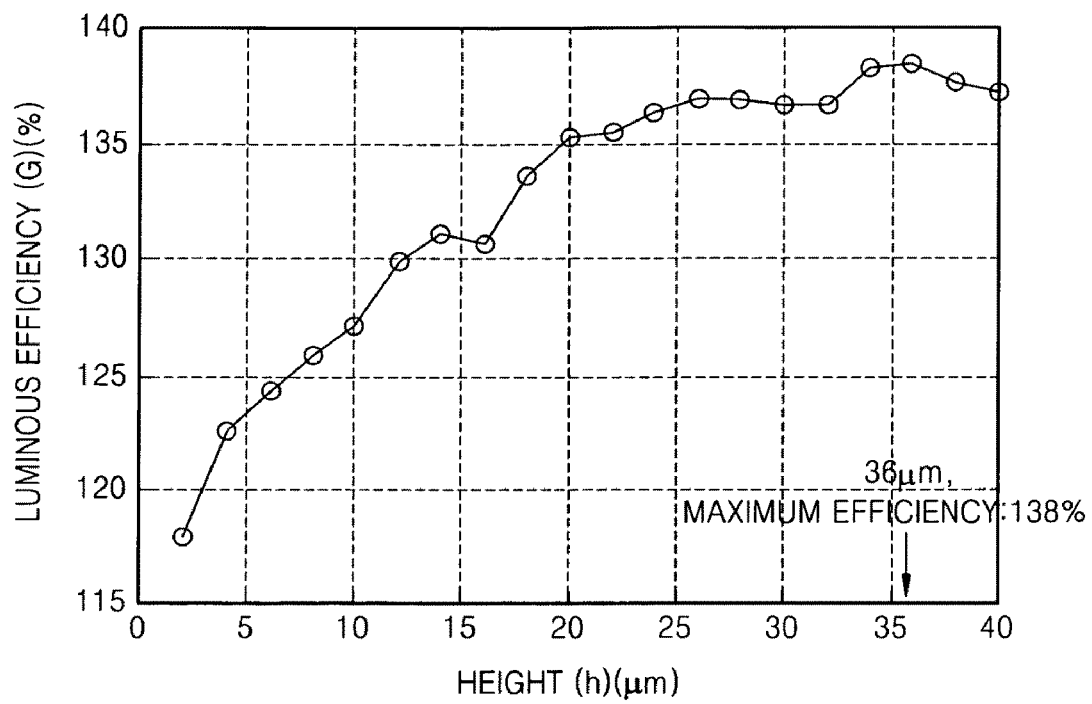
FIG. 8 is a graph of a space between a micro lens unit and a display unit according to light extraction efficiency, according to an embodiment of the present invention.

FIG. 8 is a graph of the space h between the display unit 102 and the micro lens unit 104 according to a light extraction efficiency G, according to an embodiment of the present invention. Specifically, FIG. 8 is a graph of the space h between the display unit 102 and the micro lens unit 104 according to the light extraction efficiency G with respect to the center of each lens of the organic light emitting display apparatus 100 when the size of each subpixel is about 32 µm. The average thickness (t) of the lenses of the micro lens unit 104 is about 15 µm.

Figure 5:
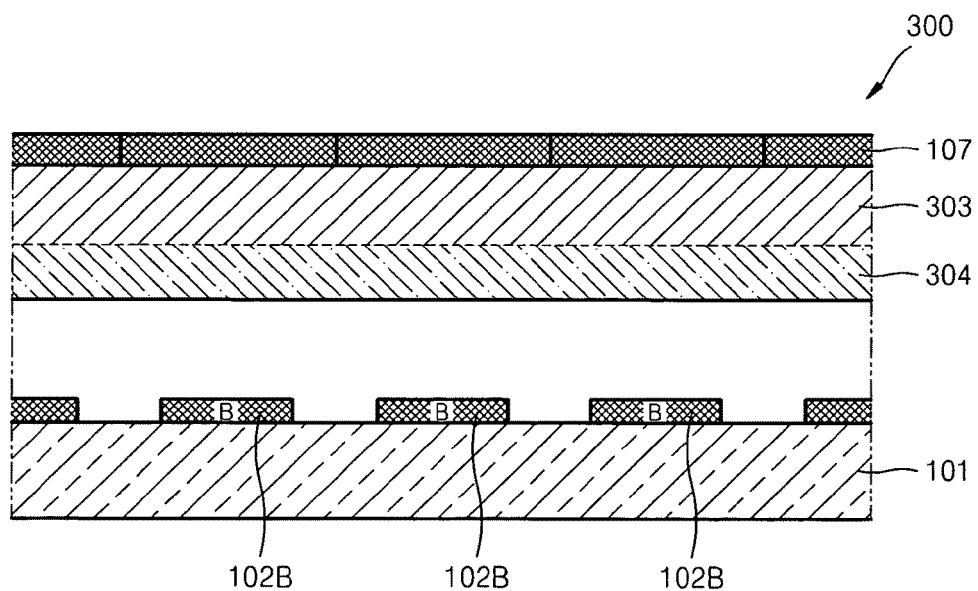
FIG. 5 is a cross-sectional view taken line II-II of FIG. 4, according to an embodiment of the present invention.

Referring to FIG. 8, as the space h between the display unit 102 and the micro lens unit 104 increases, the light extraction efficiency G increases. However, the increase of the light extraction efficiency G is limited as the space h between the display unit 102 and the micro lens unit 104 increases. That is, the light extraction efficiency G can have a maximum value of 138% when the space h between the display unit 102 and the micro lens unit 104 is about 36 µm. Accordingly, the barrier ribs 105 that function to maintain the space h between the display unit 102 and the micro lens unit 104 can be controllably formed so as to obtain the highest light extraction efficiency G. Referring to FIG. 5, when the size of each subpixel is about 32 µm and the height t of each lens of the micro lens unit 104 is about 15 µm, the highest light extraction efficiency G can be obtained when the space h between the display unit 102 and the micro lens unit 104 is about 36 µm, and thus, a height of the barrier ribs 105 is 51 µm.

Since the barrier ribs 105 define each of the subpixels, the number of barrier ribs 105 interposed between the sealing substrate 103 and the substrate 101 is large. Therefore, a bending of the sealing substrate 103 toward the substrate 101 can be prevented, and thus, the sealing substrate 103 becomes more reliable.

The micro lens unit 104 and the barrier ribs 105 can be formed integrally with the sealing substrate 103. That is, a surface of the sealing substrate 103 is etched to form a plurality of lenses and the barrier ribs 105.

The black matrix 106 can be formed in lower parts of the barrier ribs 105 which are adjacent to the substrate 101. The black stripes 106 define the subpixels 102R, 102G, and 102B. The black matrix 106 absorbs light entering from the outside of organic light emitting display apparatus 100, 200, and 300 to improve a bright room contrast.

The color filter 107 can be formed on a top surface of the sealing substrate 103, which is opposite to the bottom surface of the sealing substrate 103 on which the micro lens unit 104 is formed. The subpixel 102B that emits blue light, the subpixel 102G that emits green light, and the subpixel 102R that emits red light have different light efficiencies from each other. The color filter 107 ensures a uniform light emission of each color and controls white balance.

Figure 3:
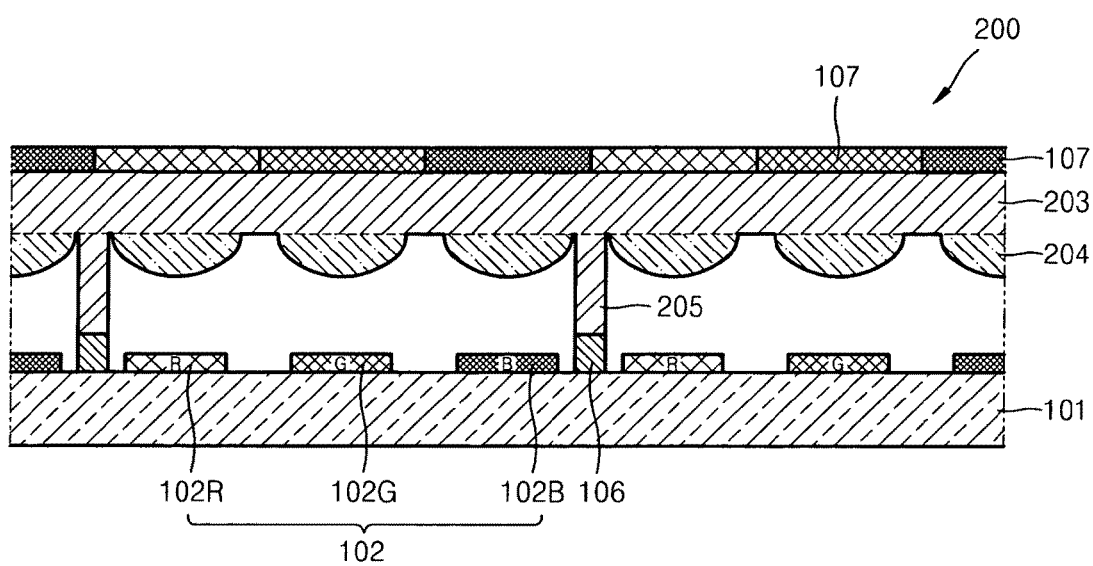
FIG. 3 is a cross-sectional view of an organic light emitting display apparatus according to another embodiment of the present invention.

FIG. 3 is a schematic cross-sectional view of an organic light emitting display apparatus 200 according to another embodiment of the present invention. The difference between the organic light emitting display apparatus 200 of FIG. 3 and the organic light emitting display apparatus 100 of FIG. 1 lies in the position of barrier ribs 205. That is, in the organic light emitting display apparatus 200 of FIG. 3, the barrier ribs 205 define a group including a blue light emitting subpixel 102B, a green light emitting subpixel 102G, and a red light emitting subpixel 102R. However, the structure of the barrier ribs 205 is not limited thereto. For example, the barrier ribs 205 can define at least one subpixel.

Referring to FIG. 3, each of the subpixels 102R, 102G, and 102B corresponds to the micro lens unit 104 on a one to one basis. However, the structure of the subpixels 102R, 102G, and 102B and the micro lens unit 104 are not limited thereto. For example, a RGB pixel including the blue light emitting subpixel 102B, the green light emitting subpixel 102G, and the red light emitting subpixel 102R can correspond to a micro lens unit (not shown).

Figure 6A:
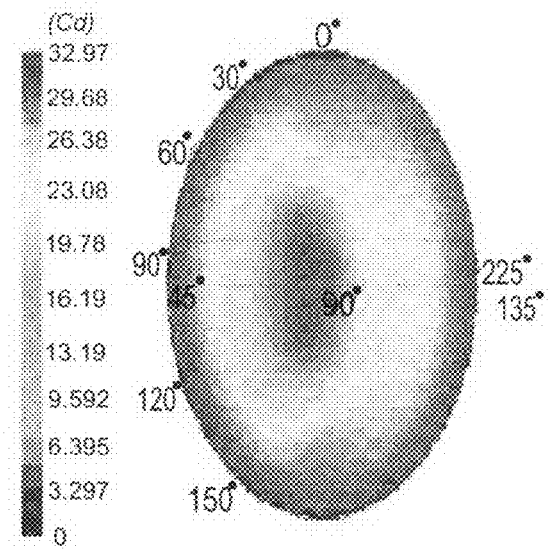
FIGS. 6A and 6B are views of simulation results showing color distortion of an organic light emitting display apparatus.
Figure 6B:
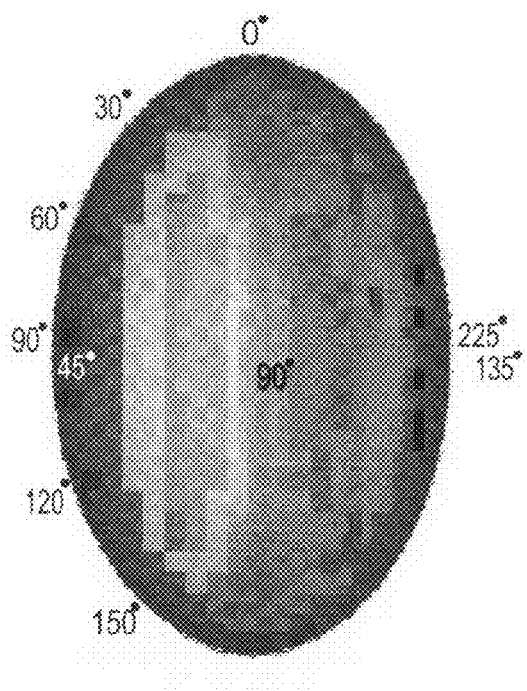
Figure 7A:
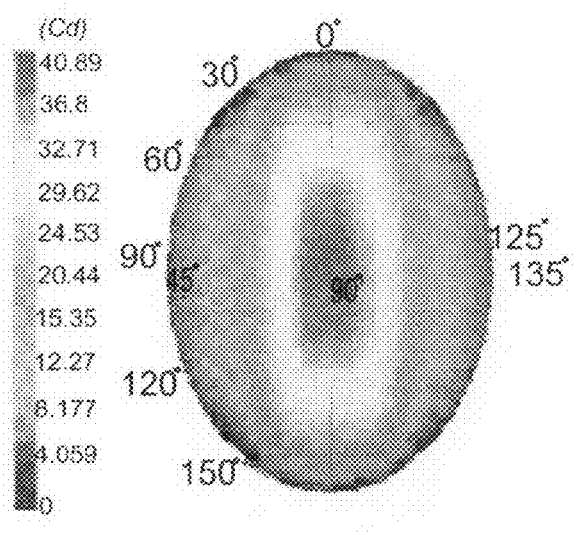
FIGS. 7A and 7B are views of simulation results showing color distortion the organic light emitting display apparatus of FIG. 1, according to an embodiment of the present invention.
Figure 7B:
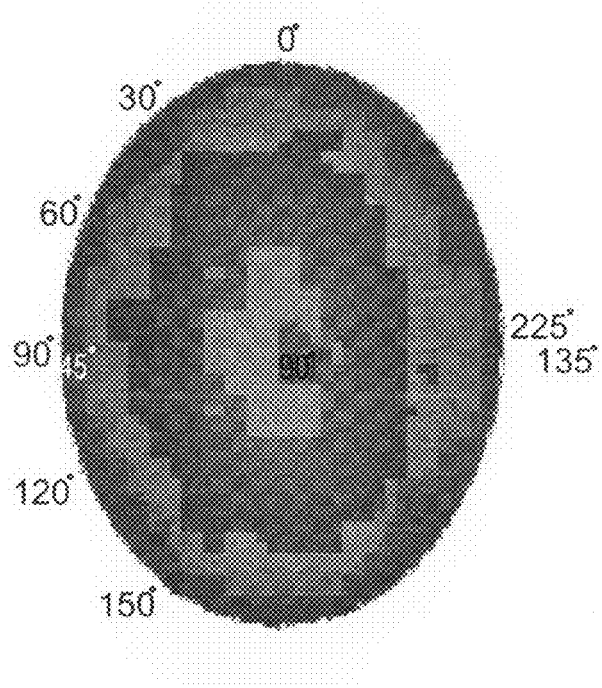

FIGS. 6A and 6B are views of simulation results showing color distortion of an organic light emitting display apparatus according to the present invention (not shown) in which a single lens commonly corresponds to three subpixels, that is, RGB pixels. FIGS. 7A and 7B are views of simulation results showing color distortion of the organic light emitting display apparatus 100 of FIG. 1. The simulation was performed while a light emission surface of the organic light emitting display apparatuses was rotated so as to identify a change in color according to the position of the organic light emitting display apparatuses.

Referring to FIGS. 6A and 6B, the red part is offset toward the left part of the diagram at 30°-150°. However, in the case of the organic light emitting display apparatus 100, as illustrated in FIGS. 7A and 7B, there is symmetry around the center of the diagram, which indicates that the color distortion phenomenon does not occur according to the location of the organic light emitting display apparatus 100. As described above, the color distortion phenomenon of the organic light emitting display apparatus 100 can be prevented due to the fact that each subpixel corresponds to each lens.

Figure 4:
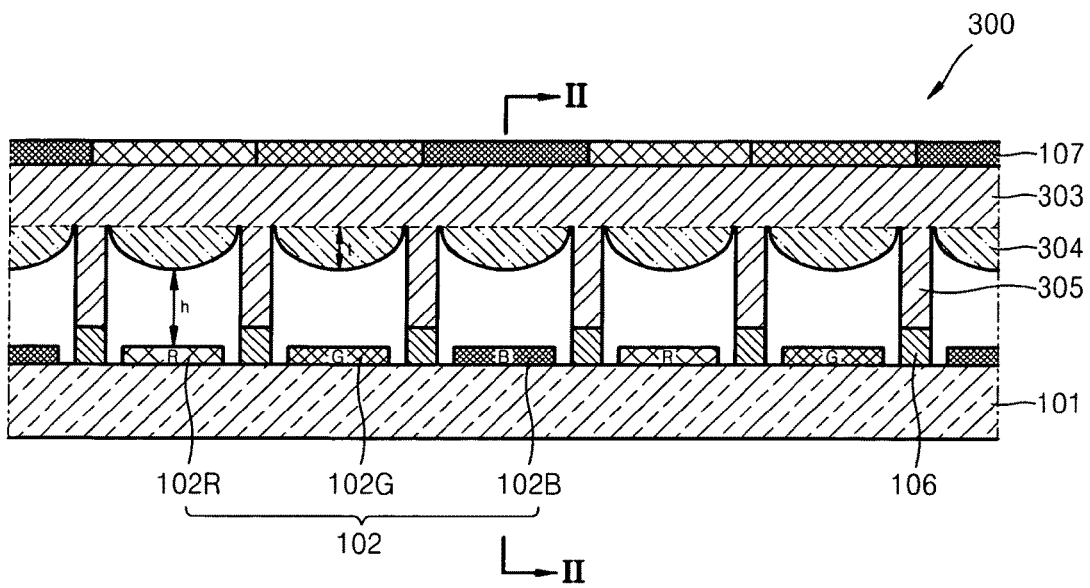
FIG. 4 is a cross-sectional view of an organic light emitting display apparatus according to still another embodiment of the present invention.

FIG. 4 is a cross-sectional view of an organic light emitting display apparatus 300 according to another embodiment of the present invention. FIG. 5 is a cross-sectional view taken along line II-II of FIG. 4, according to an embodiment of the present invention. The difference between the organic light emitting display apparatus 300 of FIG. 4 and the organic light emitting display apparatus 100 of FIG. 1 lies in a lens comprising a micro lens unit 304. Referring to FIGS. 4 and 5, the micro lens unit 304 of the organic light emitting display apparatus 300 is formed such that a single lens corresponds to a plurality of subpixels 102B that emit the same color light. A red light emitting subpixel 102R, a green light emitting subpixel 102G, and a blue light emitting subpixel 102G are sequentially disposed in a row on the substrate 101, and subpixels that emit the same color are disposed in a column on the substrate 101. FIG. 5 is a cross-sectional view taken along line II-II of FIG. 4, in which the subpixels 102B that emit the same color light are disposed in a column. Referring to FIG. 5, the micro lens unit 304 of the organic light emitting display apparatus 300 is formed such that a lens corresponds to subpixels 102B that emit the same color disposed in a column. The micro lens unit 304 can be a cylindrical lens that may correspond to a plurality of subpixels disposed in a column. In addition, the lens of the micro lens unit 304 can be a lenticular lens.

Figure 9:
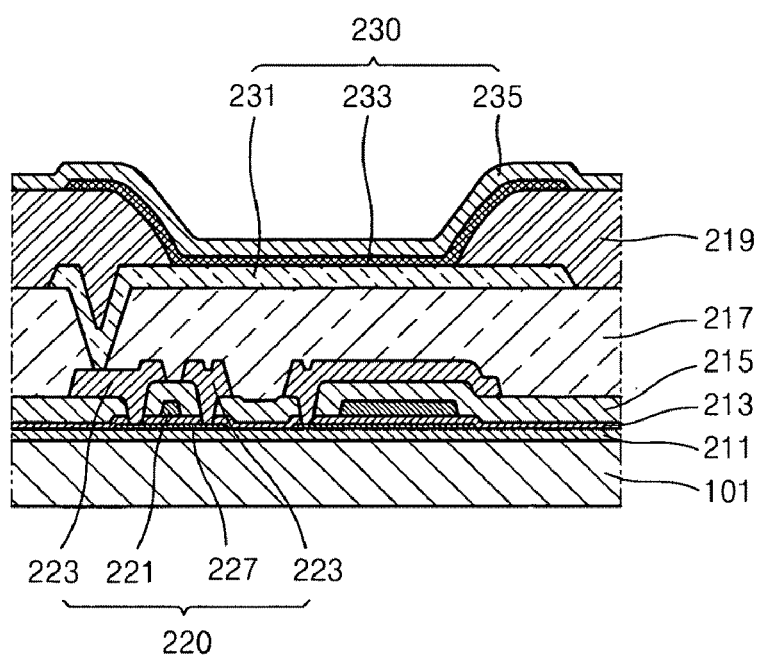
FIG. 9 is a cross-sectional view of a display unit of the organic light emitting display apparatus of FIG. 1, according to an embodiment of the present invention.

FIG. 9 is a cross-sectional view of the display unit 102 of the organic light emitting display apparatus 100 of FIG. 1, according to an embodiment of the present invention.

Referring to FIG. 9, a thin film transistor 220 is disposed on the substrate 101, and an organic light emitting device 230 is disposed on the thin film transistor 220. The organic light emitting device 230 includes a pixel electrode 231 electrically connected to the thin film transistor 220, an opposite electrode 235 disposed on the entire surface of the substrate 101, and an interlayer 233 including an emission layer (not shown) disposed between the pixel electrode 231 and the opposite electrode 235.

The thin film transistor 220 including a gate electrode 221, a source electrode and drain electrode 223, a semiconductor layer 227, a gate insulating layer 213, and an interlayer insulating layer 215 are formed on the substrate 101. The structure of the thin film transistor 220 is not limited to the structure of FIG. 9. For example, the thin film transistor 220 can be an organic thin film transistor including the semiconductor layer 227 formed of an organic material, or a silicon thin film transistor including the semiconductor layer 227 formed of silicon. If needed, a buffer layer 211 formed of silicon oxide or silicon nitride can be further formed between the thin film transistor 220 and the substrate 101.

The organic light emitting device 230 includes the pixel electrode 231, the opposite electrode 235 facing the pixel electrode 231, and the interlayer 233 formed of an organic material interposed between the pixel electrode 231. The interlayer 233 includes at least an emission layer and can include other layers will be described later.

The pixel electrode 231 acts as an anode, and the opposite electrode 235 acts as a cathode. Alternatively, the pixel electrode 231 acts as a cathode, and the opposite electrode 235 acts as an anode. The pixel electrode 231 can be a transparent electrode or a reflective electrode. If the pixel electrode 231 is a transparent electrode, the pixel electrode 231 may be formed of ITO, IZO, ZnO, or $In_2O_3$. If the pixel electrode 231 is a reflective electrode, the pixel electrode 231 may be a reflective layer formed of Ag, Mg, Al, Pt, Pd, Au, Ni, Nd, Ir, Cr, or a compound thereof and then a layer formed of ITO, IZO, ZnO, or $In_2O_3$ on the reflective layer.

The opposite electrode 235 can be a transparent electrode or a reflective electrode. If the opposite electrode 235 is a transparent electrode, the opposite electrode 235 can be formed by depositing a layer of Li, Ca, LiF/Ca, LiF/Al, Al, Mg, or a compound thereof on the interlayer 233 that is between the pixel electrode 231 and the opposite electrode 235, and then forming a bus electrode or bus electrode line of a transparent electrode forming material, such as ITO, IZO, ZnO, or $In_2O_3$ thereon. If the opposite electrode 235 is a reflective electrode, the opposite electrode 235 can be formed by depositing Li, Ca, LiF/Ca, LiF/Al, Al, Mg, or a compound thereof.

A subpixel defining layer (PDL) 219 covers ends of the pixel electrode 231 and is formed to have a thickness outside the pixel electrode 231. The PDL 219 defines an emission area, and widens the interval between the ends of the pixel electrode 231 and the opposite electrode 235 in order to prevent an occurrence of a field enhancement effect at the ends of the pixel electrode 231 and of a short-circuit between the pixel electrode 231 and the opposite electrode 235.

The interlayer 233 including at least an emission layer is interposed between the pixel electrode 231 and the opposite electrode 235, and the interlayer 233 can be formed of a low molecular weight organic material or a high molecular weight organic material.

If the interlayer 233 is formed of a low molecular weight molecular weight organic material, the interlayer 233 may include a Hole Injection Layer (HIL), a Hole Transport Layer (HTL), an Organic Emission Layer (EML), an Electron Transport Layer (ETL), an Electron Injection Layer (EIL), etc., each of which can be deposited as a single layer or a multiple layer. The low molecular weight molecular weight organic material can be copper phthalocyanine (CuPc), N,N'-Di(naphthalene-1-yl)-N,N'-diphenyl-benzidine (NPB), tris-8-hydroxyquinoline aluminum (Alq3), or the like. The low molecular weight molecular weight organic material can be used through a vacuum deposition process using masks.

If the interlayer 233 is formed of a high molecular weight organic material, the interlayer 233 can include an HTL and an EML. The HTL can be formed of PEDOT, and the emission layer can be formed of a polymer organic material, such as poly-phenylenevinylene (PPV) -based polymer organic material or polyfluorene-based polymer organic material.

The organic light emitting device 230 is electrically connected to the thin film transistor 220 disposed under the organic light emitting device 230. When the thin film transistor(220) is covered by a planarization layer 217, the organic light emitting device 230 maybe disposed on the planarization layer 217. The pixel electrode 231 of the organic light emitting device 230 is electrically connected to the thin film transistor 220 through a contact hole formed in the planarization layer 217.

The organic light emitting device 230 formed on the substrate 101 is sealed by an opposite substrate 300 (not shown). The sealing substrate 103 can be formed of various materials, such as glass or a plastic material.

Although the current embodiment of the present invention has been described with reference to an active matrix-organic light emitting display apparatus including barrier ribs, the present invention is not limited thereto. That is, the present invention can be used in a Passive Matrix (PM) organic light emitting display apparatus or other flat panel display apparatuses, such as a liquid crystalline display apparatus.

According to the present invention, barrier ribs are disposed between a sealing substrate and a display unit, and thus, the interval between a micro lens unit and a display unit can be maintained so as to improve the luminosity efficiency and reliability of the sealing substrate.

While the present invention has been particularly shown and described with reference to exemplary embodiments thereof, it will be understood by one of ordinary skill in the art that various modifications in form and detail may be made therein without departing from the spirit and scope of the present invention as defined by the following claims.

What is claimed is:

1. An organic light emitting display apparatus comprising:
   a substrate;
   a display unit including a plurality of subpixels arranged on the substrate, the plurality of subpixels respectively emitting different colored light;
   a sealing substrate arranged on the display unit;
   a micro lens unit including a plurality of lenses arranged on a surface of the sealing substrate facing the display unit;
   barrier ribs arranged between the sealing substrate and the substrate to define a space between the micro lens unit and the display unit; and
   a black matrix arranged under the barrier ribs.

2. The organic light emitting display apparatus of claim 1, wherein each lens respectively corresponds to each subpixel.

3. The organic light emitting display apparatus of claim 2, wherein the barrier ribs define each subpixel.

4. The organic light emitting display apparatus of claim 2, wherein the barrier ribs define at least one subpixel.

5. The organic light emitting display apparatus of claim 3, wherein the sealing substrate, the micro lens unit, and the barrier ribs are integrally formed.

6. The organic light emitting display apparatus of claim 4, wherein the sealing substrate, the micro lens unit, and the barrier ribs are integrally formed.

7. The organic light emitting display apparatus of claim 5, wherein each lens is curved toward the display unit.

8. The organic light emitting display apparatus of claim 6, wherein each lens is curved toward the display unit.

9. The organic light emitting display apparatus of claim 7, further comprising a color filter arranged on a top surface of the sealing substrate.

10. The organic light emitting display apparatus of claim 8, further comprising a color filter arranged on a top surface of the sealing substrate.

11. The organic light emitting display apparatus of claim 1, wherein a single lens of the micro lens corresponds to a plurality of subpixels emitting the same color light.

12. The organic light emitting display apparatus of claim 11, wherein the barrier ribs are arranged between at least one pair of lenses.

13. The organic light emitting display apparatus of claim 12, wherein the sealing substrate, the micro lens unit, and the barrier ribs are integrally formed.

14. The organic light emitting display apparatus of claim 13, wherein each lens comprises a cylindrical lens.

15. The organic light emitting display apparatus of claim 13, wherein each lens comprises a lenticular lens.

16. The organic light emitting display apparatus of claim 15, further comprising a color filter arranged on a top surface of the sealing substrate.

17. An organic light emitting display apparatus comprising:
   a substrate;
   a display unit including a plurality of subpixels arranged on the substrate, the plurality of subpixels respectively emitting different colored light;
   a sealing substrate arranged over and spaced-apart from the display unit;
   a micro lens unit including a plurality of lenses arranged on a surface of the sealing substrate facing the display unit corresponding different ones of the plurality of subpixels, and the lenses being curved toward the display unit;
   barrier ribs arranged between the sealing substrate and the substrate to define a space between the micro lens unit and the display unit; and
   a black matrix arranged under the barrier ribs.

* * * * *